US008130974B2

(12) United States Patent
Sakamoto et al.

(10) Patent No.: US 8,130,974 B2
(45) Date of Patent: Mar. 6, 2012

(54) VEHICULAR ACTIVE SOUND CONTROL SYSTEM

(75) Inventors: Kosuke Sakamoto, Utsunomiya (JP); Toshio Inoue, Tochigi-ken (JP); Akira Takahashi, Tochigi-ken (JP); Yasunori Kobayashi, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 1374 days.

(21) Appl. No.: 11/715,850

(22) Filed: Mar. 9, 2007

(65) Prior Publication Data

US 2007/0223728 A1 Sep. 27, 2007

(30) Foreign Application Priority Data

Mar. 23, 2006 (JP) ................................ 2006-080106

(51) Int. Cl.
*H04B 1/00* (2006.01)
*H04R 5/00* (2006.01)
*H04R 5/02* (2006.01)
*H03G 3/00* (2006.01)

(52) U.S. Cl. ................ 381/86; 381/17; 381/18; 381/19; 381/300; 381/302; 381/310; 381/104; 381/105; 381/107

(58) Field of Classification Search .................... 381/86, 381/17–19, 87, 71.1, 71.2, 300, 302, 309, 381/310, 104–107, 71.4
See application file for complete search history.

(56) References Cited

U.S. PATENT DOCUMENTS 5,635,903 A * 6/1997 Koike et al. .................. 340/441
7,218,740 B1 * 5/2007 Kowaki ........................... 381/18

FOREIGN PATENT DOCUMENTS

JP 63-043494 A 2/1988

(Continued)

*Primary Examiner* — Devona Faulk
*Assistant Examiner* — George Monikang
(74) *Attorney, Agent, or Firm* — Arent Fox, LLP

(57) ABSTRACT

An ASC generates a control signal based on an engine rotation frequency detected by an engine rotational speed detecting means, and a speaker outputs a sound effect depending on the control signal into a vehicle. The speaker is disposed in a substantially central area of a dashboard, in front of a driver seat and a front passenger seat of the vehicle, in the transverse direction of the vehicle.

9 Claims, 1 Drawing Sheet

FOREIGN PATENT DOCUMENTS

| | | | |
|---|---|---|---|
| JP | 04-085146 | A | 3/1992 |
| JP | 04-158700 | A | 6/1992 |
| JP | 11-141350 | A | 5/1999 |
| JP | 2001-290489 | A | 10/2001 |
| JP | 3261128 | B2 | 12/2001 |
| WO | 90/13109 | A1 | 11/1990 |

* cited by examiner

VEHICULAR ACTIVE SOUND CONTROL SYSTEM

CROSS-REFERENCE TO RELATED APPLICATION

This application claims the priority of JP Application No. 2006-080106, filed Mar. 23, 2006, the entire specification, claims and drawings of which are incorporated herewith by reference.

BACKGROUND OF THE INVENTION

1. Field of the Invention

The present invention relates to a vehicular active sound control system for generating a sound effect in a vehicle depending on a running state of the vehicle, and more particularly to a vehicular active sound control system for outputting a sound effect based on a control signal depending on the rotation frequency of the engine of a vehicle, into the vehicle.

2. Description of the Related Art

There have heretofore been proposed active sound control systems for detecting an accelerating or decelerating action made by the driver of a vehicle and outputting a control signal depending on the acceleration or deceleration, as a sound effect from an output means such as speakers into the vehicle (see Japanese Laid-Open Patent Publication No. 63-43494 and Japanese Patent No. 3261128).

Since such an active sound control system is not a standard equipment system in the vehicle, the active sound control system is installed separately from an audio system in the vehicle.

If the output means for producing a sound effect for the active sound control system is shared by the audio system and the active sound control system, then the control signal depending on the acceleration or deceleration which is output from the active sound control system is combined with an audio signal from the audio system by an adder, and the combined signal is output as combined sounds (sounds depending on the sound effect and the audio signal) from the output means into the vehicle.

The output means includes door speakers mounted in the doors on the sides of front seats of the vehicle and rear speakers mounted behind the rear seats. When a sound effect depending on the running state of the vehicle, i.e., the rotation frequency of the engine, is output from these speakers into the passenger compartment of the vehicles, the passengers on the vehicle feel uncomfortable with the sound effect because the passengers hear the sound effect coming from the sides of the front seats or from behind the rear seats despite the fact that the engine is located in a front portion of the vehicle and hence the passengers tend to judge that the sound effect is not created depending on the rotation frequency of the engine.

SUMMARY OF THE INVENTION

It is an object of the present invention to provide a vehicular active sound control system for outputting a sound effect which does not make vehicle passengers feel uncomfortable.

According to the present invention, a vehicular active sound control system has a control signal generating means for generating a control signal representative of a sound change depending on a running state of a vehicle, and a first output means for outputting a sound effect based on the control signal. The vehicular active sound control system has the following features (1) through (5):

(1) The first output means is disposed in a substantially central area in front of front seats of the vehicle in the transverse direction of the vehicle.

Passengers in the vehicle hear the sound effect output from the first output means disposed forwardly of the front seats. If the running state of the vehicle is represented by an engine rotation frequency, then the passengers judge that the sound effect is created depending on the engine rotation frequency. The passengers thus do not feel uncomfortable, but can enjoy the sound effect as if listening to music. Since the passengers can obtain desired sound image localization with respect to the sound effect, i.e., perceives that the engine is positioned in the direction of the sound effect that is heard, the sound effect can be generated which does not make the passengers feel uncomfortable. The substantially central area in the transverse direction of the vehicle corresponds to an area between opposite sides of the driver on a driver seat and the passenger on a front passenger seat.

(2) Second output means for outputting the sound effect are disposed in respective opposite sides in front of the front seats in the transverse direction of the vehicle.

Since the passengers in the vehicle hear the sound effect output from the first and second output means, the passengers can obtain increased sound image localization with respect to the second effect.

(3) As the first output means is disposed in the substantially central area of the dashboard and the second output means are disposed in the respective opposite sides of the dashboard.

Therefore, the sound image localization obtained by the passengers with respect to the sound effect is further increased.

(4) The first output means is in the form of a squawker and the second output means are in the form of tweeters.

The squawker outputs a sound effect in a frequency range from 300 [Hz] to 4000 [Hz] including sounds at frequencies equal to or higher than 200 [Hz], which are highly directional for the auditory sensation of the passengers, and the tweeters output a sound effect in a higher frequency range from 1000 [Hz] to 20000 [Hz]. Consequently, the sound image localization with respect to the sound effect is increased, allowing the passengers to hear a highly directional sound effect.

(5) The vehicular active sound control system further includes a control signal amplifying means for amplifying the control signal and outputting the amplified control signal to the first and second output means. The control signal amplifying means has a gain variable based on the running state of the vehicle.

Therefore, the passengers are allowed to hear a sound effect that is highly creative and preferable.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
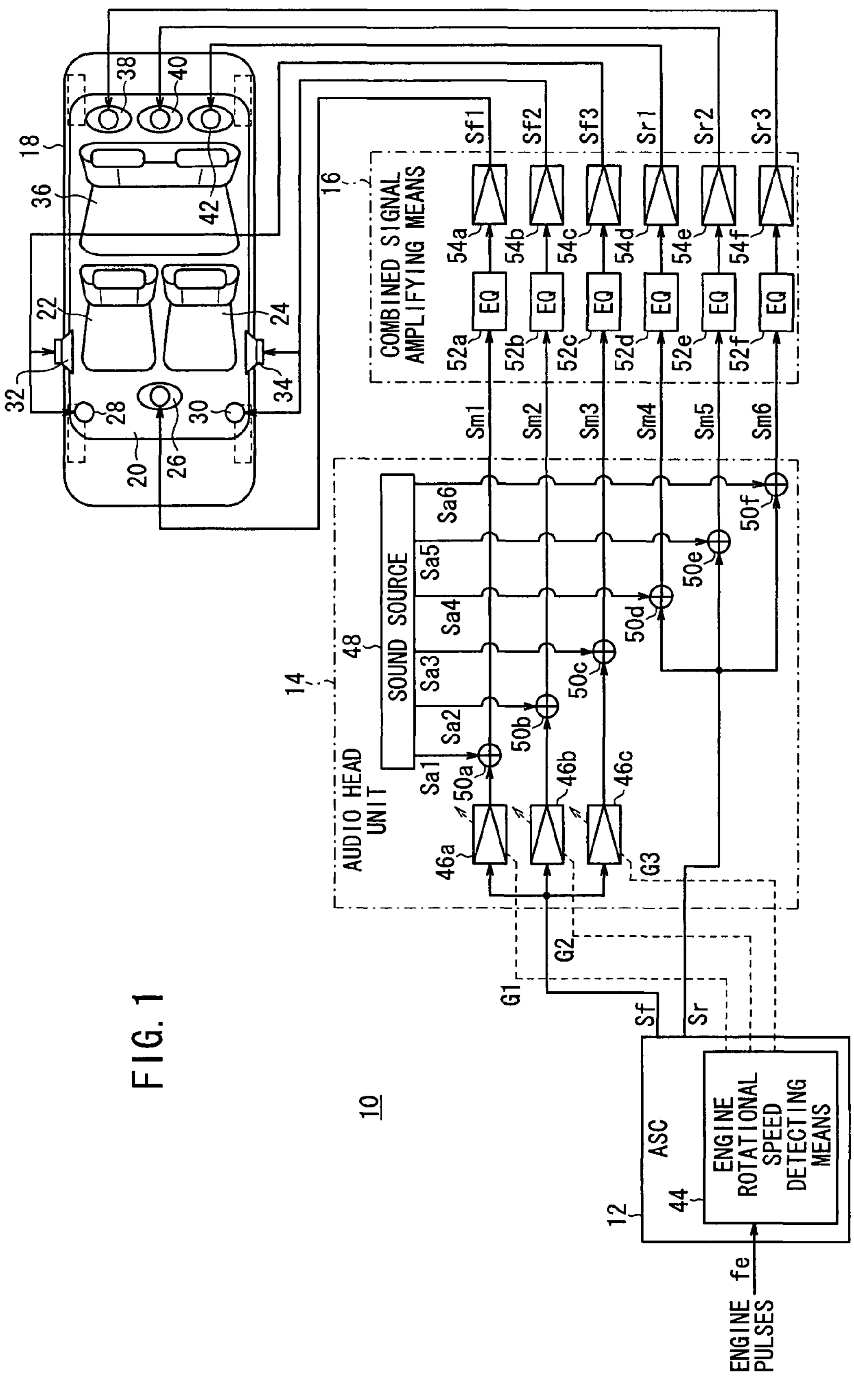
FIG. 1 is a block diagram of a vehicular active sound control system according to an embodiment of the present invention.

As shown in FIG. 1, a vehicular active sound control system 10 according to an embodiment of the present invention is mounted on a vehicle 18. The vehicular active sound control system 10 basically comprises a control signal generating means (hereinafter referred to as "ASC") 12 implemented by an ECU (Electronic Control Unit) for generating control signals Sf, Sr for an active sound effect, an audio head unit 14 for combining audio signals Sa1 through Sa6 and the control signals Sf, Sr to generate combined signals 5 ml through Sm6, a combined signal amplifying means 16 for amplifying the combined signals 5 ml through Sm6 and outputting output signals Sf1 through Sf3, Sr1 through Sr3, and speakers 26 through 34, 38 through 42 for outputting sounds based on the output signals Sf1 through Sf3, Sr1 through Sr3. The ASC 12 is installed as an optional unit in the vehicle 18, and the audio head unit 14, the combined signal amplifying means 16, and the speakers 26 through 34, 38 through 42 are installed as standard equipment in the vehicle 18.

The ASC 12 is mounted in a dashboard 20 positioned in front of a driver seat 22 and a front passenger seat 24, i.e., front seats, of the vehicle 18. The ASC 12 has an engine rotational speed detecting means 44 including a frequency counter for detecting the frequency fe of engine pulses (engine rotation frequency) generated by a Hall device or the like per revolution of the output shaft of an engine (not shown) on the vehicle 18, as representing a running state of the vehicle 18. The ASC 12 generates control signals Sf, Sr indicative of a sound change based on the detected engine rotation frequency fe.

Specifically, the ASC 12 uses the engine rotation frequency fe as a fundamental frequency, generates a reference signal having harmonics based on the fundamental frequency, and generates the control signals Sf, Sr based on the reference signal. The control signal Sf serves to output a sound effect from the speakers 26 through 34, and the control signal Sr serves to output a sound effect from the speakers 38 through 42 arranged behind the rear seat 36. The sound effects output from the speakers 26 through 34, 38 through 42 are created sounds based on the control signals Sf, Sr.

The audio head unit 14 is disposed substantially centrally in the dashboard 20, and has amplifiers (control signal amplifying means) 46*a* through 46*c*, a sound source 48, and mixers 50*a* through 50*f*. The sound source 48 comprises a CD, a cassette tape, a radio tuner, or the like.

The amplifiers 46*a* through 46*c* are variable-gain amplifiers whose gains G1 through G3 vary based on the engine rotation frequency fe detected by the engine rotational speed detecting means 44. The amplifiers 46*a* through 46*c* amplify the control signal Sf supplied thereto and output the amplified control signal Sf to the mixers 50*a* through 50*c*.

The mixers 50*a* through 50*c* combine the control signal Sf amplified by the amplifiers 46*a* through 46*c* with audio signals Sa1 through Sa3 from the sound source 48, and output combined signals 5 ml through Sm3 to the combined signal amplifying means 16. The mixers 50*d* through 50*f* combine the control signal Sr with audio signals Sa4 through Sa6 and output combined signals Sm4 through Sm6 to the combined signal amplifying means 16.

The combined signal amplifying means 16 has equalizers 52*a* through 52*f* and amplifiers 54*a* through 54*f*. The equalizers 52*a* through 52*f* adjust the levels of the combined signals 5 ml through Sm6 in a certain frequency range and output the equalized combined signals 5 ml through Sm6 to the amplifiers 54*a* through 54*f*. The amplifiers 54*a* through 54*f* amplify the combined signals 5 ml through Sm6 from the equalizers 52*a* through 52*f* and output the amplified signals as output signals Sf1 through Sf3, Sr1 through Sr3 to the speakers 26 through 34, 38 through 42.

Of the amplifiers 54*a* through 54*f*, (a) the amplifier 54*a* connected to the speaker 26 has the greatest gain, (b) the amplifier 54*b* connected to the speakers 30, 34 and the amplifier 54*c* connected to the speakers 28, 32 have the second greatest gain, and (c) the amplifier 54*f* connected to the speaker 38 behind a rear seat 36, the amplifier 54*e* connected to the speaker 40 behind the rear seat 36, and the amplifier 54*d* connected to the speaker 42 behind the rear seat 36 have the smallest gain.

The speaker (first output means) 26 comprises a squawker disposed in a substantially central area of the dashboard 20 in the transverse direction of the vehicle 18 for outputting the output signals Sf1 in the frequency range from 300 [Hz] to 4 [kHz] as sounds into the vehicle 18. The substantially central area of the dashboard 20 in the transverse direction of the vehicle 18 corresponds to an area between opposite sides of the driver on the driver seat 22 and the passenger on the front passenger seat 24.

The speakers (second output means) 28, 30 comprise tweeters disposed in respective left and right areas, i.e., opposite sides, of the dashboard 20 in the transverse direction of the vehicle 18 for outputting the output signals Sf2, Sf3 in the frequency range from 1 [kHz] to 20 [kHz] as sounds into the vehicle 18.

The speakers 32, 34 comprise full-range door speakers disposed on the doors alongside of the driver seat 22 and the front passenger seat 24 for outputting the output signals Sf2, Sf3 in the frequency range from 40 [Hz] to several tens [kHz] as sounds into the vehicle 18. The speakers 38, 40, 32 comprise full-range rear speakers disposed behind the rear seat 36 for outputting the output signals Sr1 through Sr3 in the frequency range from 40 [Hz] to several tens [kHz] as sounds into the vehicle 18.

As described above, the mixers 50*a* through 50*f* combine the control signals Sf1 through Sf3, Sr1 through Sr3 with the audio signals Sa1 through Sa6 to generate the combined signals 5 ml through Sm6, and the output signals Sf1 through Sf3, Sr1 through Sr3 based on the combined signals 5 ml through Sm6 are output to the speakers 26 through 34, 38 through 42. Therefore, the sounds output from the speakers 26 through 34, 38 through 42 are combinations of the sound effect depending on the control signals Sf1 through Sf3, Sr1 through Sr3 based on the engine rotation frequency fe and the sounds based on the audio signals Sa1 through Sa6 from the sound source 48.

Specifically, when the engine rotational speed detecting means 44 detects the engine rotation frequency fe, the ASC 12 outputs the control signals Sf, Sr based on the detected engine rotation frequency fe to the audio head unit 14. The amplifiers 46*a* through 46*c* of the audio head unit 14 amplify the control signals Sf, Sr based on gains G1 through G3 which have changed depending on the engine rotation frequency fe. The mixers 50*a* through 50*c* output the combined signals 5 ml through Sm3, which represent combinations of the amplified control signal Sr and the audio signals Sa1 through Sa3, to the combined signal amplifying means 16. The mixers 50*d* through 50*f* output the combined signals Sm4 through Sm6, which represent combinations of the amplified control signal Sr and the audio signals Sa4 through Sa6, to the combined signal amplifying means 16. The equalizers 52*a* through 52*f* of the combined signal amplifying means 16 adjust the levels of the combined signals 5 ml through Sm6 in a certain frequency range. The amplifiers 54*a* through 54*f* amplify the combined signals 5 ml through Sm6 from the equalizers 52*a* through 52*f* and output the amplified signals as output signals Sf1 through Sf3, Sr1 through Sr3 to the speakers 26 through 34, 38 through 42.

The speaker 26 outputs the output signals Sf1 in the frequency range from 300 [Hz] to 4 [kHz] as sounds into the vehicle 18. The speakers 28, 30 output the output signals Sf2, Sf3 in the frequency range from 1 [kHz] to 20 [kHz] as sounds into the vehicle 18. The speakers 32, 34, 38 through 42 output the output signals Sf2, Sf3, Sr1 through Sr3 in the frequency range from 40 [Hz] to several tens [kHz] as sounds into the vehicle 18.

Since the gains of the amplifiers 54*a* through 54*f* are successively smaller as indicated above in (a) through (c), i.e., the gain of the amplifier 54*a* is the greatest, the gain of the amplifiers 54*b*, 54*c* is the second greatest, and the gain of the amplifiers 54*d*, 55*e*, 54*f* are the smallest, the sounds output from the speaker 26 are the strongest, the sounds output from the speakers 28, 30, 32, 34 are the second strongest, and the sounds output from the speakers 38, 40, 42 are the weakest.

As describe above, the vehicular active sound control system 10 has the engine rotational speed detecting means 44 which detects the engine rotation frequency fe of the vehicle 18, the ASC 12 which generates the control signals Sf, Sr representing a sound change depending on the detected engine rotation frequency fe, and the speaker 26 which outputs a sound effect depending on the generated control signal Sf. The vehicular active sound control system 10 offers the following advantages (1) through (5):

(1) Inasmuch as the speaker 26 is disposed in the substantially central area of the dashboard 20, forward of the driver seat 22 and the front passenger seat 24, in the transverse direction of the vehicle 18, the passengers in the vehicle 18 hear the sound effect output from the speaker 26 disposed forward of the driver seat 22 and the front passenger seat 24. Therefore, the passengers judge that the sound effect is created depending on the engine rotation frequency fe. The passengers thus do not feel uncomfortable, but can enjoy the sound effect as if listening to music. Since the passengers can obtain desired sound image localization with respect to the sound effect, i.e., perceives that the engine is positioned in the direction of the sound effect that is heard, the sound effect does not make the passengers feel uncomfortable.

(2) Because the speakers 28, 30 for outputting the sound effect are disposed in the respective left and right areas of the dashboard 20 in the transverse direction of the vehicle 18, the passengers in the vehicle 18 hear the sound effect output from the speakers 26 through 30 and can obtain increased sound image localization.

(3) As the speaker 26 is disposed in the substantially central area of the dashboard 20 and the speakers 28, 30 are disposed in the respective left and right areas of the dashboard 20, the sound image localization obtained by the passengers with respect to the sound effect is further increased.

(4) The speaker 26 is in the form of a squawker and the speakers 28, 30 are in the form of tweeters. The squawker (the speaker 26) outputs a sound effect in a frequency range from 300 [Hz] to 4000 [Hz] including sounds at frequencies equal to or higher than 200 [Hz], which are highly directional for the auditory sensation of the passengers, and the tweeters (the speakers 28, 30) output a sound effect in a higher frequency range from 1000 [Hz] to 20000 [Hz]. Consequently, the passengers recognize the sound effect as being heard in the directions of the speakers 28, 30, i.e., in the direction of the engine, rather than in the directions of the speakers 32, 34, 38 through 42. The sound image localization with respect to the sound effect is increased, allowing the passengers to hear a highly preferable sound effect.

For example, if the ASC 12 generates a control signal Sf having a 4.5th harmonic or a 6th harmonic from the fundamental frequency (3rd) (fe=250 Hz) in combustion and expansion strokes of a six-cylinder engine, then the speaker 26 outputs sounds including a sound effect having a frequency of 375 [Hz] (4.5th harmonic) or 500 [Hz] (6th harmonic) into the vehicle 18. Therefore, the passenger can easily recognize that the sound effect is a sound created with respect to the engine.

(5) The gains G1 through G3 of the amplifiers 46*a* through 46*c* for amplifying the control signal Sf and outputting the amplified control signal Sf to the speakers 26 through 30 are changed based on the engine rotation frequency fe to allow the passengers to hear a sound effect that is highly creative and preferable.

Since the gains of the amplifiers 54*a* through 54*f* are successively smaller as indicated above in (a) through (c), i.e., the gain of the amplifier 54*a* is the greatest, the gain of the amplifiers 54*b*, 54*c* is the second greatest, and the gain of the amplifiers 54*d*, 55*e*, 54*f* are the smallest, the sounds output from the speaker 26 are the strongest, the sounds output from the speakers 28, 30, 32, 34 are the second strongest, and the sounds output from the speakers 38, 40, 42 are the weakest. As a result, the passengers perceive the sound effect with respect to the engine as heard from the front area of the vehicle 18, and hence the sound effect is recognized as highly creative.

Although a certain preferred embodiment of the present invention has been shown and described in detail, it should be understood that various changes and modifications may be made therein without departing from the scope of the appended claims.

What is claimed is:

1. A vehicular active sound control system comprising:

control signal generating means for generating a control signal representative of a sound change depending on an engine rotation frequency of a vehicle;

audio signal generating means for generating an audio signal from a sound source;

first output means disposed in a substantially central area in front of front seats of said vehicle in the transverse direction of said vehicle;

second output means disposed in respective left and right areas in front of the front seats of said vehicle in the transverse direction of said vehicle;

third output means disposed in a rear area behind a rear seat of said vehicle;

first amplifying means disposed between the control signal generating means and the first output means, for amplifying the control signal and outputting a first amplified control signal;

second amplifying means disposed between the control signal generating means and the second output means, for amplifying the control signal and outputting a second amplified control signal;

first combined signal output means disposed between the first amplifying means and the first output means, for combining the first amplified control signal output from the first amplifying means with the audio signal and outputting the combined signal as a first combined signal;

second combined signal output means disposed between the second amplifying means and the second output means, for combining the second amplified control signal output from the second amplifying means with the audio signal and outputting the combined signal as a second combined signal;

third combined signal output means disposed between the control signal generating means and the third output means, for combining the control signal with the audio signal and outputting the combined signal as a third combined signal;

third amplifying means disposed between the first combined signal output means and the first output means, for amplifying the first combined signal and outputting a first amplified combined signal;

fourth amplifying means disposed between the second combined signal output means and the second output means, for amplifying the second combined signal and outputting a second amplified combined signal; and fifth amplifying means disposed between the third combined signal output means and the third output means, for amplifying the third combined signal and outputting a third amplified combined signal;

wherein a gain of the first amplifying means and a gain of the second amplifying means are changed based on the engine rotation frequency.

2. A vehicular active sound control system according to claim 1, wherein said first output means is disposed substantially centrally in a dashboard of said vehicle, and said second output means are disposed on opposite sides of said dashboard.

3. A vehicular active sound control system according to claim 1, wherein said first output means comprises a squawker, and said second output means comprise tweeters.

4. A vehicular active sound control system comprising:

control signal generating means for generating a control signal representative of a sound change depending on an engine rotation frequency of a vehicle;

audio signal generating means for generating an audio signal from a sound source;

first output means disposed in a substantially central area in front of front seats of said vehicle in the transverse direction of said vehicle;

second output means disposed in respective left and right areas in front of the front seats of said vehicle in the transverse direction of said vehicle;

third output means disposed in a rear area behind a rear seat of said vehicle;

first amplifying means disposed between the control signal generating means and the first output means, for amplifying the control signal and outputting a first amplified control signal;

second amplifying means disposed between the control signal generating means and the second output means, for amplifying the control signal and outputting a second amplified signal;

first combined signal output means disposed between the first amplifying means and the first output means, for combining the first amplified control signal output from the first amplifying means with the audio signal and outputting the combined signal as a first combined signal;

second combined signal output means disposed between the second amplifying means and the second output means, for combining the second amplified control signal output from the second amplifying means with the audio signal and outputting the combined signal as a second combined signal;

third combined signal output means disposed between the control signal generating means and the third output means, for combining the control signal with the audio signal and outputting the combined signal as a third combined signal;

third amplifying means disposed between the first combined signal output means and the first output means, for amplifying the first combined signal and outputting a first amplified combined signal;

fourth amplifying means disposed between the second combined signal output means and the second output means, for amplifying the second combined signal and outputting a second amplified combined signal; and fifth amplifying means disposed between the third combined signal output means and the third output means, for amplifying the third combined signal and outputting a third amplified combined signal;

wherein among the third, fourth and fifth amplifying means, a gain of the third amplifying means is the greatest, a gain of the fourth amplifying means is the second greatest gain, and a gain of the fifth amplifying means is the smallest gain.

5. A vehicular active sound control system according to claim 4, wherein said first output means is disposed substantially centrally in a dashboard of said vehicle, and said second output means are disposed on opposite sides of said dashboard.

6. A vehicular active sound control according to claim 4, wherein said first output means comprises a squawker, and said second output means comprise tweeters.

7. A vehicular active sound control system comprising:

control signal generating means for generating a control signal representative of a sound change depending on an engine rotation frequency of a vehicle;

audio signal generating means for generating an audio signal from a sound source;

first output means disposed in a substantially central area in front of front seats of said vehicle in the transverse direction of said vehicle;

second output means disposed in respective left and right areas in front of the front seats of said vehicle in the transverse direction of said vehicle;

third output means disposed in a rear area behind a rear seat of said vehicle;

first amplifying means disposed between the control signal generating means and the first output means, for amplifying the control signal and outputting a first amplified control signal;

second amplifying means disposed between the control signal generating means and the second output means, for amplifying the control signal and outputting a second amplified control signal;

first combined signal output means disposed between the first amplifying means and the first output means, for combining the first amplified control signal output from the first amplifying means with the audio signal and outputting the combined signal as a first combined signal;

second combined signal output means disposed between the second amplifying means and the second output means, for combining the second amplified control signal output from the second amplifying means with the audio signal and outputting the combined signal as a second combined signal;

third combined signal output means disposed between the control signal generating means and the third output means, for combining the control signal with the audio signal and outputting the combined signal as a third combined signal;

third amplifying means disposed between the first combined signal output means and the first output means, for amplifying the first combined signal and outputting a first amplified combined signal;

fourth amplifying means disposed between the second combined signal output means and the second output means, for amplifying the second combined signal and outputting a second amplified combined signal; and fifth amplifying means disposed between the third combined signal output means and the third output means, for amplifying the third combined signal and outputting a third amplified combined signal;

wherein a gain of the first amplifying means and a gain of the second amplifying means are changed based on the engine rotation frequency, and wherein among the third, fourth and fifth amplifying means, a gain of the third amplifying means is the greatest, a gain of the fourth amplifying means is the second greatest, and a gain of the fifth amplifying means is the smallest.

8. A vehicular active sound control system according to claim 7, wherein said first output means is disposed substantially centrally in a dashboard of said vehicle, and said second output means are disposed on opposite sides of said dashboard.

9. A vehicular active sound control according to claim 7, wherein said first output means comprises a squawker, and said second output means comprise tweeters.

* * * * *